United States Patent
Carr et al.

(10) Patent No.: US 10,971,949 B2
(45) Date of Patent: Apr. 6, 2021

(54) SYSTEMS AND METHODS FOR PERFORMING BUILDING ENERGY MANAGEMENT

(71) Applicant: ABB Schweiz AG, Baden (CH)

(72) Inventors: Joseph Carr, Raleigh, NC (US); Alexander Brissette, Raleigh, NC (US); Tao Cui, Princeton, NJ (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/639,206

(22) Filed: Jun. 30, 2017

(65) Prior Publication Data
US 2018/0191197 A1 Jul. 5, 2018

Related U.S. Application Data

(60) Provisional application No. 62/441,228, filed on Dec. 31, 2016.

(51) Int. Cl.
*H02J 13/00* (2006.01)
*H02J 3/14* (2006.01)
(Continued)

(52) U.S. Cl.
CPC ......... *H02J 13/0013* (2013.01); *G01R 11/56* (2013.01); *G06Q 50/06* (2013.01);
(Continued)

(58) Field of Classification Search
None
See application file for complete search history.

(56) References Cited

U.S. PATENT DOCUMENTS 5,481,140 A * 1/1996 Maruyama ............... H02J 3/14
307/11
9,383,737 B2 7/2016 Fonts Zaragoza et al.
(Continued)

FOREIGN PATENT DOCUMENTS

WO 2004/023624 A1 3/2004

OTHER PUBLICATIONS

Madden, P. D. (Oct. 1985). Advanced Energy Management. In Telecommunications Energy Conference, 1985. Intelec'85. Seventh International (pp. 389-393). IEEE. (Year: 1985).*

(Continued)

*Primary Examiner* — Mohammad Ali
*Assistant Examiner* — Joshua T Sanders
(74) *Attorney, Agent, or Firm* — Taft Stettinius & Hollister LLP

(57) ABSTRACT

A method for performing energy management for a building includes generating a stack of energy loads representative of a plurality of building energy loads. The energy loads are prioritized from highest priority energy loads to lowest priority energy loads. The prioritized energy loads are then compared to a building power threshold. The lowest priority energy loads are shed until a sum of remaining energy loads is equal to or less than the building power threshold. The remaining energy loads are serviced. The processes of prioritizing the energy loads, comparing the prioritized energy loads to a building power threshold, and shedding the lowest priority energy loads is repeated in response to changes in circumstances affecting the building.

20 Claims, 2 Drawing Sheets

(51) Int. Cl.
  *G06Q 50/06* (2012.01)
  *G01R 11/56* (2006.01)
  *F24F 11/46* (2018.01)
(52) U.S. Cl.
  CPC .......... *H02J 3/14* (2013.01); *F24F 11/46* (2018.01); *H02J 2310/14* (2020.01); *Y02B 70/30* (2013.01); *Y02B 70/3225* (2013.01); *Y04S 20/222* (2013.01); *Y04S 20/242* (2013.01)

(56) References Cited

U.S. PATENT DOCUMENTS

| | | | | |
|---|---|---|---|---|
| 2004/0075343 | A1* | 4/2004 | Wareham | H02J 3/14 307/39 |
| 2010/0019574 | A1* | 1/2010 | Baldassarre | H02J 3/14 307/23 |
| 2012/0153725 | A1* | 6/2012 | Grohman | H02J 3/14 307/39 |
| 2012/0166007 | A1 | 6/2012 | Jeong et al. | |
| 2014/0163750 | A1 | 6/2014 | Brady et al. | |
| 2014/0214215 | A1 | 7/2014 | Han et al. | |
| 2015/0057820 | A1 | 2/2015 | Kefayati et al. | |
| 2015/0167997 | A1* | 6/2015 | Saffre | F24F 11/0009 700/276 |

OTHER PUBLICATIONS

Thomas Weng et al., "Managing Plug-Loads for Demand Response within Buildings," BuildSys '11, ACM ISBN 978-1-4503-0749-9, Seattle, WA, USA Nov. 1-4, 2011 (6 pages).

Varick L. Erickson et al., "Occupancy Based Demand Response HVAC Control Strategy," BuildSys '10, ACM ISBN 978-1-4503-0458-0, Zurich, Switzerland Nov. 2, 2010 (6 pages).

* cited by examiner

SYSTEMS AND METHODS FOR PERFORMING BUILDING ENERGY MANAGEMENT

TECHNICAL FIELD

The present application generally relates to energy management, and more particularly, but not exclusively, to systems and methods for performing building energy management.

BACKGROUND

Energy management of various types, e.g., building energy management, remains an area of interest. Some existing systems have various shortcomings, drawbacks and disadvantages relative to certain applications. For example, in some building energy management systems, substantial processing resources are required for implementation. Accordingly, there remains a need for further contributions in this area of technology.

SUMMARY

One embodiment of the present invention is unique method for performing energy management for a building. Another embodiment is a unique building energy management system for managing the energy usage of a building. Other embodiments include apparatuses, systems, devices, hardware, methods, and combinations for performing building energy management. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
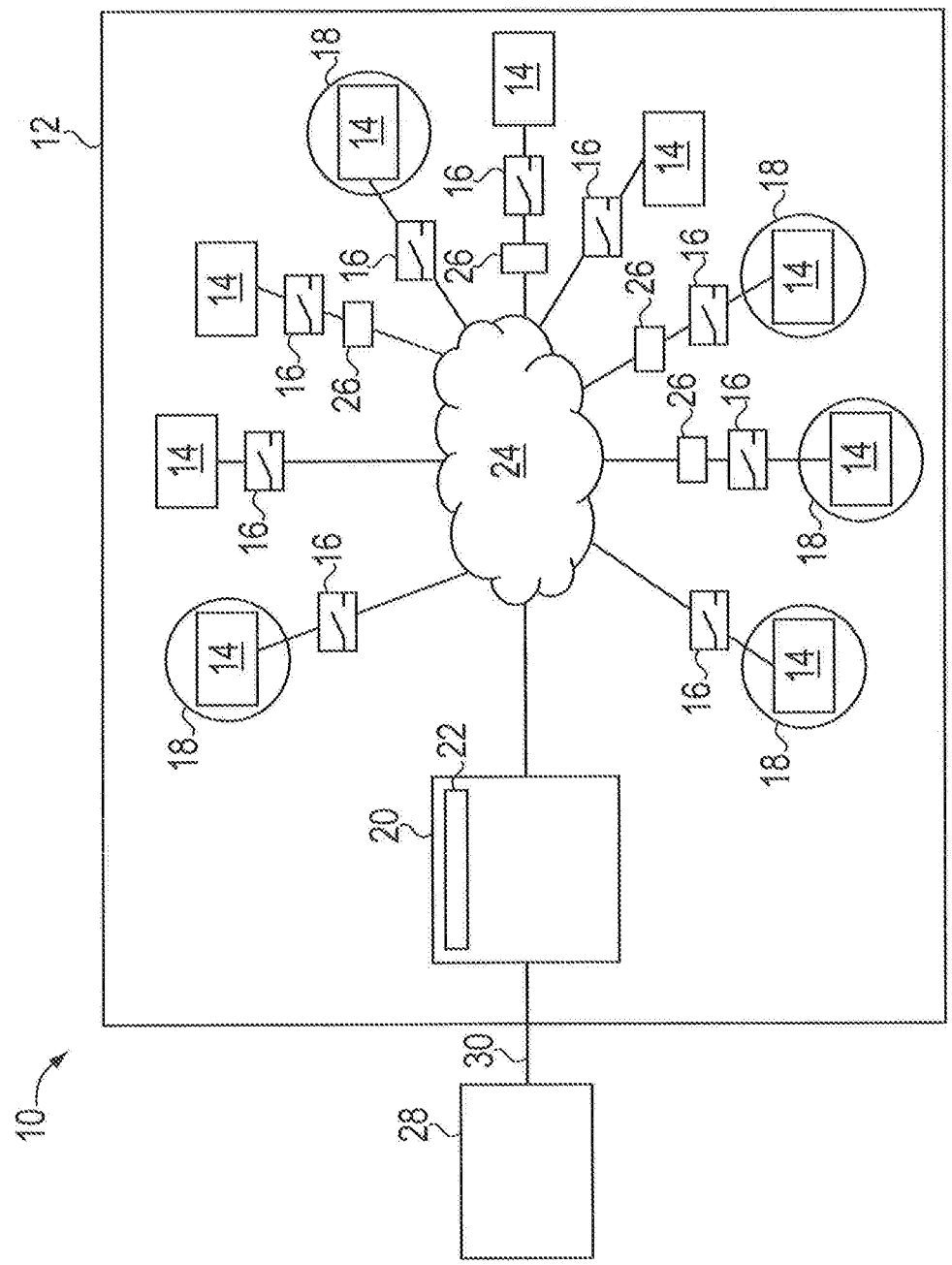
FIG. 1 schematically illustrates some aspects of a non-limiting example of a building having electrical loads and a building energy management system in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of a building energy management system 10 for managing the energy usage of a building 12 having a plurality of electrical loads 14 are illustrated in accordance with an embodiment of the present invention. In some embodiments, building energy management system 10 may be part of a building automation system. Electrical loads 14 may be or include any electrical load associated with or controlled by a building or group of buildings, such as one or more lighting systems, appliances, computer, server and related systems, HVAC systems and/or electrically powered machines of any type. The number and type of electrical loads 14 in FIG. 1 may vary with the needs of the building and application. Each electrical load 14 may represent a single load or a cluster of loads.

Power flow to each electrical load 14 is controlled by a switch element 16. Switch elements 16 may be, for example, circuit breakers, contactors, relays and/or thermostats or other HVAC (heating, ventilation and/or air conditioning) system control elements. In various embodiments, switch elements may be collocated, e.g., in a common enclosure, or may be distributed throughout various locations. Switch elements 16 are operative to control power flow to electrical loads 14, e.g., by turning electrical loads 14 on and off. In some embodiments, building 12 may include one or more thermal or other HVAC zones 18, e.g., rooms or groups of rooms or other spaces/volumes within the building, wherein the temperature, humidity and/or ventilation is handled or supplied by an electrical load 14 in the form of an HVAC load, wherein power flow to the HVAC system is controlled by adjusting a setpoint on a switch element 16 in the form of thermostat, humidistat and/or other HVAC control device from a normal setting to a reduced-power setting. The normal setting or setpoint is the setpoint normally employed for the HVAC load when power is not sought to be reduced to meet a building power threshold by shedding that HVAC load, whereas the reduced-power setting or setpoint is the setpoint used when power is reduced by shedding the HVAC load to meet a building power threshold. For example, an HVAC load may be shed by lowering a temperature setpoint in winter months or by increasing a temperature setpoint in summer months. Some embodiments may include more than one level of reduced-power setpoints.

System 10 includes a controller 20 and a memory 22 associated therewith. Controller 20 is in communication with the electrical loads 14, in particular, with switch elements 16. In one form, controller 20 is in communication with switching elements 16 via a network 24. In other embodiments, controller 20 may be in direct or indirect communication with switching elements 16 with or without the use of a network. In one form, network 24 is a Wi-Fi network. In other embodiments, network 24 may be a local area network, a control area network, the internet or any suitable wired and/or wireless network protocol and structure. In some embodiments, one or more switch elements 16 are constructed for direct network connection. Some embodiments may include one or more gateways 26 for coupling one or more switch elements to network 24 and controller 20.

Figure 2:
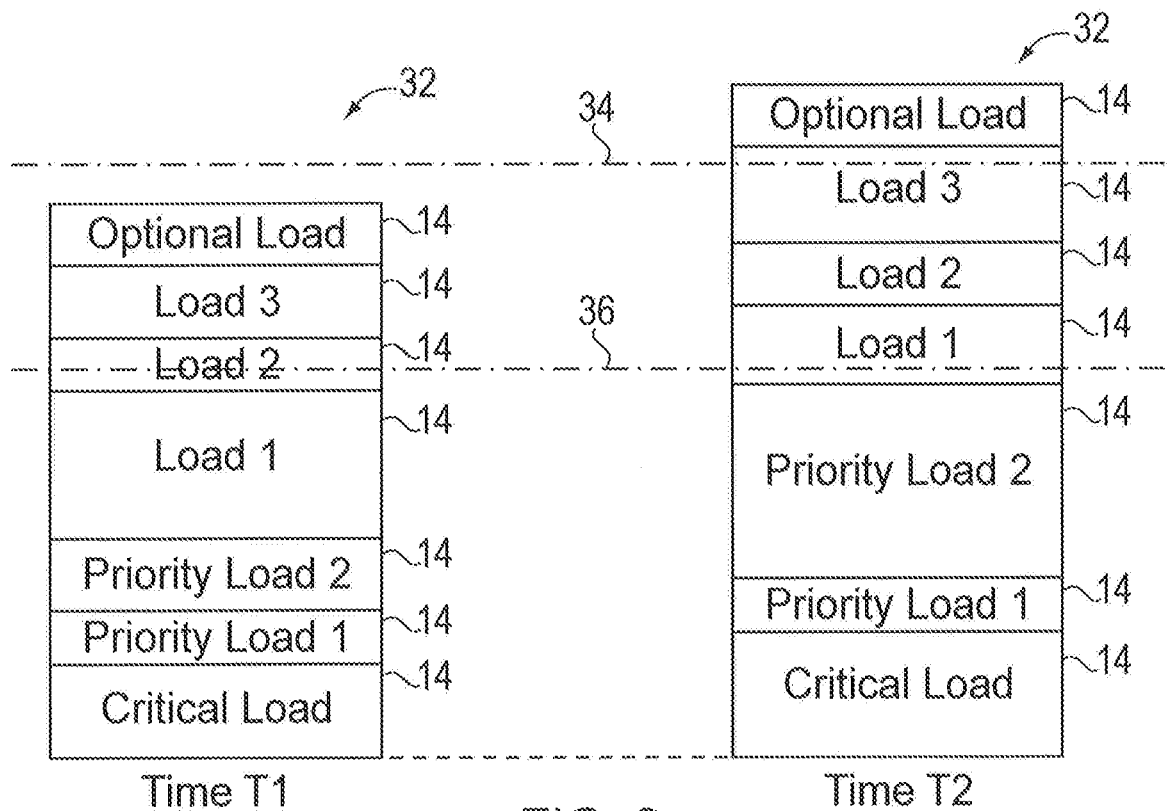
FIG. 2 illustrates some aspects of a non-limiting example of building loads arranged by priority in a stack at two different times in accordance with an embodiment of the present invention.

Referring to FIG. 2, in some embodiments, the building loads 14 are arranged according to a priority list or stack 32, and a power threshold is defined, e.g., a normal power threshold used in the absence of a demand response signal (described below). The electrical loads 14 illustrated in FIG. 2 and characterization thereof are by way of a non-limiting example only, and are not necessarily reflective of the electrical loads 14 illustrated in FIG. 1. The electrical loads 14 of FIG. 2 include a CRITICAL LOAD, a PRIORITY LOAD 1, a PRIORITY LOAD 2, a LOAD 1, a LOAD 2, a LOAD 3 and an OPTIONAL LOAD. The loads are illustrated in FIG. 2 at a time T1 and a time T2. In some embodiments, the vertical height of each particular load represents the magnitude of the load, which may vary with time. The loads are arranged in terms of importance, with the most important and hence highest priority load at the bottom of the stack 32, and the lowest priority loads at the top of the stack—the priority of a particular load is given by the relative location of the loads in the stack, with priority decreasing with height from the bottom of the stack. The assigned importance and hence priority progressively reduces in the upward direction in FIG. 2 to the least important and hence lowest priority load at the top of the stack 32. In accordance with some embodiments, loads above the power threshold are shed or disconnected. It will be understood that the stack depiction of FIG. 2 is by way of example only, and that other representations of load stacks may be employed in other embodiments.

Various embodiments include methods and systems for controlling a building energy management system, which in some embodiments includes responding to demand response signals from a utility, e.g., an electric power grid utility. Building energy management system 10 is operative to change the building power threshold based on a demand response signal received from a power utility. For example, building energy management system 10 may be coupled to a utility demand response program 28 via, for example, the internet 30. One or more demand response signals may be received from the utility, e.g., demand response program 28, which may be used to set power thresholds, e.g., power thresholds that are reduced relative to normal power thresholds employed in the absence of a demand response signal. Thus, some embodiments employ a dynamic power threshold based on demand response signals. Upon receiving a demand response event signal from the utility, e.g., from demand response program 28, a new demand response power threshold is set, e.g., based on a pre-programmed value provided by the user and negotiated with the utility. Any loads that increase the total building power above the new threshold will result in one or more loads above the threshold being shed or disconnected based on priority, whereas during normal operation without a demand response signal, only loads above the normal threshold are shed or disconnected. In various embodiments, when the total building power consumption exceeds the currently applied threshold, the loads are shed in ascending order of priority (i.e., the loads are shed starting with the lowest priority load). When the building power consumption drops below the threshold (either because the threshold rises or the power consumption level falls or both), previously shed loads are restored in descending order of priority (i.e., the most important or highest priority previously shed loads are restored first), in a manner complementary to the load shedding. In some embodiments, other energy loads may be shed and restored as described herein, in addition to or in place of electrical loads, e.g., natural gas loads (e.g., natural gas powered systems and equipment) or loads powered by other energy sources, such as oil or other liquid fuel).

Illustrated in FIG. 2 are a power threshold 34 and a power threshold 36. In one form, power threshold 34 is the normal power threshold, and power threshold 36 is a reduced power threshold set in response to a demand response signal from demand response program 28. A normal power threshold is, for example, a power threshold typically employed by the owner or operator of building 12 in order to control building 12 power consumption, e.g., generally or, for example, based on an agreement with the power utility as to building 12 average power consumption. Power threshold 36 is a reduced threshold value relative to power threshold 34 used in response to demand response program 28.

If the power at the input of the building exceeds the power threshold, the loads are shed or disconnected, e.g., sequentially from the lowest priority to the highest priority, until power consumption, e.g., remaining electrical loads are equal to or less than the power threshold. As set forth above, the building power threshold may be adjusted, e.g., based on inputs from the utility. For example, the power threshold 34 may be reduced to one or more lower values, e.g., power threshold 36, in response to a utility signal indicating a demand response event, which may enable the building owner or operator to participate in demand response programs, potentially improving the stability of the grid during peak loading in some embodiments, while minimizing the discomfort experienced by the building occupants, e.g., as set forth herein. After the end of the demand response event, the power threshold may be restored to an initial value (e.g., power threshold 34) or other value.

Once the loads are prioritized, the energy use of the building is managed by the application of the power threshold, e.g., power threshold 34 (or power threshold 36 if a demand response signal is received). In one non-limiting example, the building power is measured, and if the building power exceeds the threshold, the lowest priority load, e.g., the topmost load in the stack, is shed, e.g., by opening the breaker serving the load or by another shedding procedures, e.g., as described herein, and the building power is measured again. If the power threshold is still exceeded, the next lowest priority load is shed, and the process is repeated until the building power no longer exceeds the threshold. In other embodiments, other methodologies may be employed to shed loads to achieve a building power usage at or below the power threshold.

Referring to the example of FIG. 2, at time T1, the power supplied to the electrical loads in stack 32 is below power threshold 34, and hence, the application of power threshold 34 does not result in the shedding of any loads. However, if power threshold 36 were implemented, e.g., in response to a signal received from demand response program 28 at controller 20, the electrical loads 14 labeled as LOAD 2, LOAD 3 and OPTIONAL LOAD would have to be shed in order to remain below power threshold 36. At time T2, the power usage of the building is greater, and hence LOAD 3 and OPTIONAL LOAD would have to be shed in order to remain below power threshold 34. However, if power threshold 36 were implemented at time T2, e.g., in response to a signal received from demand response program 28 at controller 20, the electrical loads 14 labeled as LOAD 1, LOAD 2, LOAD 3 and OPTIONAL LOAD would have to be shed in order to remain below power threshold 36.

In some embodiments, loads are prioritized dynamically, wherein the prioritization of the stack, e.g., stack 32 changes, e.g., in response to changes in circumstances affecting the building. Examples of changes in circumstances affecting the building may include, for example and without limitation, changes in occupancy, such as where a previously occupied HVAC zone 18 becomes unoccupied or experiences a reduction or an increase in occupation, or where a previously unoccupied HVAC zone 18 becomes occupied. The changes in occupancy may be indicated to controller 20 via sensors located in the different thermal zones, e.g., proximity or thermal sensors (not shown), for example, or may be indicated by the occupants turning on lights or computers or appliances, or may be manually indicated by a building manager or owner or operator. Changes in HVAC zone occupation may affect the priority given to electrical loads 14 in the form of thermal or other HVAC loads, and in some embodiments may affect priority given to other loads such as lighting loads. As another example, a critical or high priority machine or device may be turned on, thus altering the current priority scheme. In some embodiments, the passage of time, e.g., some period of time, may be considered a change in circumstance that affects the building.

In some embodiments, thermal or other HVAC loads may be shed by adjusting thermal or other HVAC setpoints. For example, certain of the electrical loads 14 include HVAC loads for HVAC zones 18. Each HVAC zone is regulated by a thermostat, humidistat and/or other HVAC control device which influences the HVAC heating, ventilation and/or cooling of the zone. This influence may be, for example, in terms of adjusting the state of a baffle, increasing or decreasing a fan speed, or changing the temperature of a heating or cooling element or changing the output of a humidifier or dehumidifier. Each HVAC zone can be considered one load in the load priority stack. These loads can be dynamically adjusted, e.g., according to procedures described herein.

In one form, the occupancy and the historical temperature data of each HVAC zone 18 is measured. The historical temperature data is used to calculate a rate of change of temperature. The HVAC zones 18 are then divided into, e.g., two bins: occupied and unoccupied zones. All occupied zones are assigned a higher priority than all unoccupied zones. If a previously unoccupied HVAC zone 18 becomes occupied, its priority is increased, whereas if a previously occupied HVAC zone 18 becomes unoccupied, its priority is decreased. In some embodiments, priority may also vary with degree of occupancy. For example, an HVAC zone 18 having a greater amount of occupants may have a higher priority than an HVAC zone 18 having a lower number of occupants, or its priority may increase as occupancy increases or decrease as occupancy decreases. Within each bin, the priority is determined by the rate of change of temperature or other comfort parameter, such as humidity, or degree of ventilation. The assigned priority for a given electrical load for an HVAC zone 18 increases with increasing rate of change of temperature. For example, electrical loads 14 associated with HVAC zones 18 with higher rates of change of temperature (or other parameter, e.g., rate of change of humidity) are considered to have a higher priority than electrical loads 14 associated with HVAC zones 18 with a lower rate of change of temperature. This is because the occupants of zones with lower rates of change are expected to experience less discomfort if HVAC service to their zone is disrupted, since it would take longer for the temperature or other parameter in the zone to change. Higher rates of change might correspond to, for example, rooms on the sunlit side of the building in the summer, rooms with a large number of occupants, or rooms with relatively less or poor insulation. All of these conditions correlate to rooms where it may be desirable to the occupants to prioritize HVAC activity and ensure comfort.

Once the priority of the thermal zones is determined, the priority stack is adjusted to reflect the new priority. In some embodiments, the adjustment of the priority stack may be continuous in response to a change in circumstances, e.g., occupancy, rate of change of temperature or other parameter, e.g., wherein the priority is changed as the circumstances change. In other embodiments, the priority may be updated on a periodic or other basis. Unoccupied zones and zones with low rates of change of temperature or another parameter are moved toward the top of the stack, and are therefore shed first, when required to meet a power threshold. This shedding may be, for example, as described herein.

Figure 3:
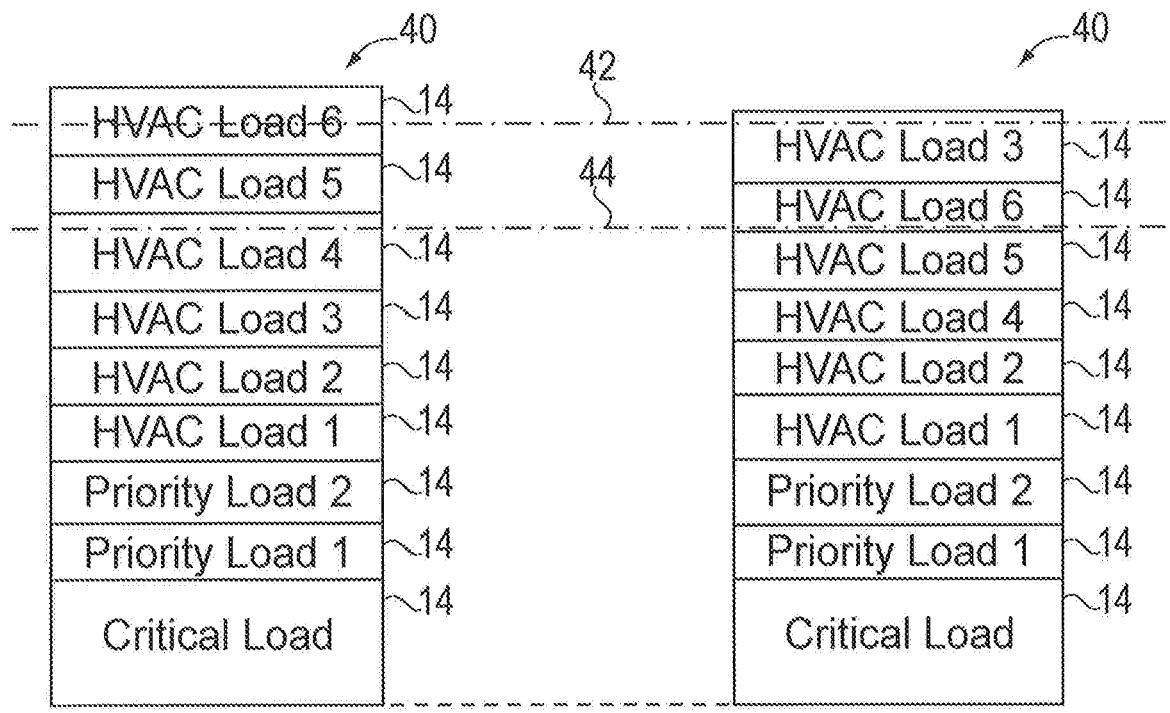
FIG. 3 illustrates some aspects of a non-limiting example of building loads arranged by priority in a stack at two different times in accordance with an embodiment of the present invention.

Referring to FIG. 3, some aspects of non-limiting examples of a load stack 40 at times T3 and T4 are illustrated in accordance with an embodiment of the present invention. The building loads 14 are arranged according to a priority list or stack 40, e.g., in the manner described above with respect to FIG. 2, wherein the highest priority load is at the bottom of stack 40 and the lowest priority load is at the top of stack 40. The electrical loads 14 illustrated in FIG. 3 and characterization thereof are by way of a non-limiting example only, and not necessarily reflective of the electrical loads 14 illustrated in FIGS. 1 and 2.

The electrical loads 14 of FIG. 3 include a CRITICAL LOAD, a PRIORITY LOAD 1, a PRIORITY LOAD 2, an HVAC LOAD 1, an HVAC LOAD 2, an HVAC LOAD 3, an HVAC LOAD 4, an HVAC LOAD 5 and an HVAC LOAD 6. In some embodiments, the vertical height of each load represents the magnitude of the load. The loads are arranged in terms of importance, with the most important and hence highest priority load at the bottom of the stack 32. The assigned importance and hence priority progressively reduces in the upward direction in FIG. 3 to the least important and hence lowest priority load at the top of the stack 40. In accordance with some embodiments, loads above the power threshold are shed or disconnected. FIG. 3 illustrates a power threshold 42 and a power threshold 44. In one form, power threshold 42 is the normal power threshold e.g., the power threshold normally used for the building absent a demand response signal; and power threshold 44 is a reduced power threshold, e.g., set in response to a demand response signal from demand response program 28.

At time T3, the application of power threshold 42 would result in the shedding of HVAC LOAD 6, which is partially above threshold 42. If power threshold 44 were implemented, e.g., in response to a signal received from demand response program 28 at controller 20, the electrical loads 14 labeled as HVAC LOAD 4, HVAC LOAD 5 and HVAC LOAD 6 would have to be shed in order to remain below power threshold 44. At time T4, the power usage of the building is slightly greater than at time T3, and is still greater than power threshold 42. At time T4, the HVAC loads have been prioritized differently than at time T3, e.g., due to changes in occupancy in the HVAC zones 18 corresponding to HVAC LOAD 3 and HVAC LOAD 6, which have shifted to the lowest priority positions subsequent to a dynamic reprioritization. If power threshold 44 were implemented at time T4, e.g., in response to a signal received from demand response program 28 at controller 20, the electrical loads 14 labeled as HVAC LOAD 3 and HVAC LOAD 6 would have to be shed in order to remain below power threshold 44.

Load shedding for HVAC loads may be implemented by the building automation system in one or more of various manners. For example, in some embodiments, each HVAC zone 18 has at least two schedules for the HVAC load equipment. These schedules may define the setpoints of the thermostat, humidistat and/or other HVAC control device, water cooling or heating temperatures, fan speeds, etc. The first schedule is for normal operation and the second schedule is for load shedding operation. A third schedule may turn the HVAC load or equipment off altogether, or may operate the equipment at some intermediate level. Each schedule may be defined by the user, e.g., a building manager, with the load shedding schedule selected in order to use less power than the normal schedule while still preventing an HVAC zone 18 from becoming overly uncomfortable. In other embodiments, other processes may be employed to shed HVAC loads, e.g., in addition to or in place of adjusting the setpoints of the thermostat, humidistat and/or other HVAC control device, water cooling or heating temperatures, fan speeds, etc.

In some embodiments, one or more HVAC zones 18 may have a gateway 26 that associates a binary signal with the two schedules. If the signal is false, the normal schedule is used, while a true signal switches the zone to the load shedding schedule. In some embodiments, the binary signal may be set by an energy management function, which may be in an external device (and hence is communicated to the building automation system over a communication network) or in an internal program (in which case the signal value is set by an energy management program internal to the building automation system).

Controller 20 is configured and operative to execute program instructions stored in the memory 22 to manage the energy usage of building 12, i.e., manage the electrical loads 14. In one form, controller 20 executes program instructions to generate a stack of electrical loads representative of a plurality of building electrical loads, e.g., similar to stacks 32 and 40 illustrated in respective FIGS. 2 and 3, and to prioritize the electrical loads, e.g., by a degree of importance. The prioritization may be based on inputs supplied by a user interface in some embodiments. In some embodiments, prioritization may also be performed, e.g., based on sensed temperature or ambient condition parameter history, e.g., humidity, and based on sensed or otherwise determined or reported occupancy of HVAC zones 18, e.g., as described above. The stack extends from a stack bottom having a highest priority electrical load to a stack top having a lowest priority electrical load. In one form, controller 20 executes program instructions to compare the prioritized electrical loads to a building power threshold, and to direct the operation of the switch elements 16 to shed lowest priority electrical loads until the sum of the remaining electrical loads (including HVAC loads) is equal to or less than the building power threshold, and to service the remaining electrical loads, i.e., providing electrical power to each of the electrical loads that are disposed below the threshold or using a normal setpoint or setting of the thermostat, humidistat and/or other HVAC control device for the HVAC load. This servicing of electrical loads includes restoring previously shed loads, i.e., directing the switch element 16 to turn the load back on or to change from a reduced HVAC setpoint to a normal HVAC setpoint for loads that were shed in a previous prioritization iteration but not shed in the current iteration's prioritization, e.g., owing to an increase in priority for the load since the previous iteration, for example, wherein the load is an HVAC load, and the occupancy of the corresponding building area or thermal zone has increased since the previous iteration's prioritization. Controller 20 executes program instructions to dynamically repeat the prioritizing of the stack, the comparing to the threshold and the directing the switch elements to shed and service the loads in response to changes in circumstances affecting the building, e.g., changes in occupancy in the different HVAC zones 18, changes of time of day, changes in solar heating, etc.

Some embodiments ensure that the building occupants do not experience excessive discomfort when participating in energy management schemes. For example, many demand response programs experience low participation rates because users or consumers do not wish to have their HVAC turned off on particularly hot or cold days. The prioritization in some embodiments aids the user in identifying lower priority loads that can be cut while having minimal impact on occupant comfort. The adjustment of the temperature by changing setpoints rather than disabling the HVAC also helps to ensure that the occupant will not experience an excessively uncomfortable or dangerous temperature excursion, which may improve the adoption rate of building energy management systems and the participation rate in demand response programs.

Some embodiments represent an alternative to highly complex building energy management schemes. Some energy management solutions rely on both a thermal model of the managed building and a computationally intensive optimization solver. The optimization solver requires a costly, powerful processing unit, while the building model requires a large effort toward study and commissioning. The expense and complexity of some building energy management systems has slowed their adoption by building owners.

Some embodiments overcome the problem of selecting what loads to cut by arranging them in a load priority. The building energy management system will then be able to disconnect or otherwise shed the lower priority loads until the power target is achieved. This automates the system, an improvement over building manager intervention. It also ensures that a target power is consistently achieved, an improvement over pre-programmed load shedding schemes. Finally, the target power is dynamic, and there can even be multiple demand response power settings for different scenarios. This is an improvement over the existing energy management systems.

In some embodiments, the rule-based algorithm described herein requires little computational power and can be implemented by inexpensive processors. The use of measured temperature change over time is a much simpler and less expensive alternative to a building thermal model, as it captures all the information otherwise generated and used by the model (e.g., zone heat capacity, thermal resistance of walls, influence of weather effects such as sunlight, etc) without prior knowledge of the building characteristics.

Embodiments of the present invention include a method for performing energy management for a building, comprising: (a) generating a stack of energy loads representative of a plurality of building energy loads; (b) prioritizing the stack of energy loads from highest priority energy loads to lowest priority energy loads; (c) comparing the prioritized energy loads to a building power threshold; (d) shedding the lowest priority energy loads until a sum of remaining energy loads is equal to or less than the building power threshold, and servicing the remaining energy loads; and (e) dynamically repeating steps (b), (c) and (d) in response to changes in circumstances affecting the building.

In a refinement, the method further comprises changing the building power threshold in response to an external signal.

In another refinement, the building power threshold is changed based on a demand response signal received from a power utility.

In yet another refinement, the building has a plurality of thermal zones; and at least some of the energy loads are HVAC (heating, ventilation and/or air conditioning) loads corresponding to the plurality of thermal zones.

In still another refinement, each thermal zone has an HVAC setpoint; and the HVAC load for each thermal zone is shed by adjusting the HVAC setpoint.

In yet still another refinement, an occupied thermal zone is designated as a higher priority than an unoccupied thermal zone.

In a further refinement, the method further comprises determining a rate of change of temperature of the plurality of the thermal zones, wherein each thermal zone of the plurality of thermal zones is assigned a priority based on the rate of change of temperature for the each thermal zone.

In a yet further refinement, the assigned priority increases with increasing rate of change of temperature.

Embodiments of the present invention include a building energy management system for managing the energy usage of a building having a plurality of energy loads, comprising: a plurality of switch elements in correspondence with the plurality of energy loads, each switch element being operative to control a power flow to a corresponding energy load; a controller and a memory accessible thereto, the controller being in communication with the plurality of switch elements, wherein the controller is configured to execute program instructions stored in the memory to manage the energy usage of the building by performing the acts of: (a) generating a stack of energy loads representative of a plurality of building energy loads; (b) prioritizing the stack of energy loads by a degree of importance from highest priority energy loads to lowest priority energy loads; (c) comparing the prioritized energy loads to a building power threshold; (d) directing the operation of the plurality of switch elements to shed lowest priority energy loads until a sum of the remaining energy loads is equal to or less than the building power threshold, and servicing the remaining energy loads; and (e) dynamically repeating steps (b), (c) and (d) in response to changes in circumstances affecting the building.

In a refinement, the system further comprises a gateway coupling at least one of the switch elements to the controller.

In another refinement, the system further comprises a network, wherein the controller is in communication with the switch elements via the network.

In yet another refinement, the building energy management system is operative to change the building power threshold based on a demand response signal received from a power utility.

In still another refinement, the building has a plurality of thermal zones; and at least some of the energy loads are HVAC (heating, ventilation and/or air conditioning) loads corresponding to the plurality of thermal zones.

In yet still another refinement, each thermal zone has an HVAC setpoint; and wherein the HVAC load for each thermal zone is shed by adjusting the HVAC setpoint.

In a further refinement, an occupied thermal zone is designated as a higher priority than an unoccupied thermal zone.

In a yet further refinement, the controller is configured to execute program instructions stored in the memory to manage the energy usage of the building by determining a rate of change of temperature of each of the thermal zones, wherein the each thermal zone is assigned a priority based on the rate of change of temperature for the each thermal zone.

In a still further refinement, the assigned priority increases with increasing rate of change of temperature.

Embodiments of the present invention include a method for performing energy management for a building, comprising: (a) generating a stack of energy loads including HVAC (heating, ventilation and/or air conditioning) loads corresponding to a plurality of HVAC zones of the building; (b) prioritizing the stack of energy loads, from highest priority energy loads to lowest priority energy loads; (c) comparing the prioritized energy loads to a building power threshold; (d) shedding each of the lowest priority HVAC loads that are disposed above the threshold by adjusting an HVAC switch element setpoint, and servicing each of the HVAC loads that are disposed below the threshold; and (e) dynamically repeating steps (a), (b), (c) and (d) in response to changes in circumstances affecting the building.

In a refinement, an occupied HVAC zone is assigned a higher priority than an unoccupied HVAC zone.

In another refinement, the method further comprises determining a rate of change of a comfort parameter of the plurality of the HVAC zones, wherein the each HVAC zone is assigned a priority based on the rate of change of the comfort parameter for the each HVAC zone; and wherein the assigned priority increases with increasing rate of change of the comfort parameter.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A method for performing energy management for a building, comprising:
   (a) generating a stack of energy loads representative of a plurality of building energy loads to which power is currently being supplied, at least some of the energy loads being HVAC (heating, ventilation and/or air conditioning) loads corresponding to the plurality of thermal zones, each of the HVAC loads being operable according to a first schedule, a second schedule, and a third schedule, each of the first, second, and third schedules being predetermined and corresponding to a different amount of electrical power that is to be used by the HVAC load, the amount of electrical power associated with the second and third schedules being less than the amount of electrical power associated with the first schedule, the second schedule operating the HVAC load at a level that maintains, via operation of the HVAC load, a comfort level within the associated thermal zone, the third schedule operating the HVAC load at an intermediate level of power;
   (b) prioritizing the stack of energy loads from highest priority energy loads to lowest priority energy loads;
   (c) comparing, in response to a building power threshold of the building being reduced to a reduced building power threshold, a magnitude of power consumption of the stack of energy loads to the reduced building power threshold;

(d) shedding, upon determining the magnitude of power consumption of the stack of energy loads exceeds the reduced building power threshold, the lowest priority energy loads until the magnitude of power consumption of the stack of energy loads is equal to or less than the reduced building power threshold, the shedding of the HVAC loads comprising adjusting the lowest priority energy loads from the first schedule to operating at one of the second schedule and the third schedule;

(e) re-prioritizing, in response to detection of activation of a critical load while the building power threshold is at the reduced building power threshold, the stack of energy loads;

(f) shedding, based on the re-prioritized stack of energy loads, one or more additional energy loads until the magnitude of power consumption of the stack of energy loads while the critical load is being operated is again equal to or less than the reduced building power threshold; and (g) dynamically repeating steps (b), (c) and (d) in response to changes in circumstances affecting the building.

2. The method of claim 1, further comprising changing the building power threshold to the reduced building power threshold in response to an external signal.

3. The method of claim 2, wherein the building power threshold is changed based on a demand response signal received from a power utility.

4. The method of claim 1, wherein the first, second, and third schedules each correspond to an HVAC setpoint.

5. The method of claim 1, wherein an occupied thermal zone is designated as a higher priority than an unoccupied thermal zone.

6. The method of claim 1, further comprising determining a rate of change of temperature of the plurality of the thermal zones, wherein each thermal zone of the plurality of thermal zones is assigned a priority based on the rate of change of temperature for the each thermal zone.

7. The method of claim 6, wherein the assigned priority increases with increasing rate of change of temperature.

8. The method of claim 1, further comprising turning on the critical load.

9. A building energy management system for managing the energy usage of a building having a plurality of energy loads, comprising:

a plurality of switch elements in correspondence with the plurality of energy loads, each switch element being operative to control a power flow to a corresponding energy load;

a controller and a memory accessible thereto, the controller being in communication with the plurality of switch elements, wherein the controller is configured to execute program instructions stored in the memory to manage the energy usage of the building by performing the acts of:

(a) generating a stack of energy loads representative of a plurality of building energy loads to which power is currently being supplied, a plurality of the energy loads being HVAC (heating, ventilation and/or air conditioning) loads being operable according to a first schedule, a second schedule, and a third schedule, each of the first, second, and third schedules being predetermined and corresponding to a different amount of electrical power that is to be used by the load, the amount of electrical power associated with the second and third schedules being less than the amount of electrical power associated with the first schedule, the second schedule operating the HVAC load a level that, via operation of the HVAC load, maintains a comfort level within the associated thermal zone, the third schedule operating the HVAC load at an intermediate level of power;

(b) prioritizing the stack of energy loads by a degree of importance from highest priority energy loads to lowest priority energy loads;

(c) comparing, in response to a building power threshold of the building being reduced to a reduced building power threshold, a magnitude of power consumption of the stack of energy loads to the reduced building power threshold;

(d) directing, upon determining the magnitude of power consumption of the stack of energy loads exceeds the reduced building power threshold, the operation of the plurality of switch elements to shed lowest priority energy loads until the magnitude of power consumption of the stack of energy loads is equal to or less than the reduced building power threshold, the shedding of the HVAC loads comprising adjusting some of the lowest priority HVAC loads from the first schedule to the second schedule and adjusting other of the lowest priority HVAC loads from the first schedule to the third schedule;

(e) re-prioritizing, in response to detection of activation of a critical load while the building power threshold is at the reduced building power threshold, the stack of energy loads;

(f) shedding, based on the re-prioritized stack of energy loads, one or more additional energy loads until the magnitude of power consumption of the stack of energy loads while the critical load is being operated is again equal to or less than the reduced building power threshold; and (g) dynamically repeating steps (b), (c) and (d) in response to changes in circumstances affecting the building.

10. The system of claim 9, further comprising a gateway coupling at least one of the switch elements to the controller.

11. The system of claim 9, further comprising a network, wherein the controller is in communication with the switch elements via the network.

12. The system of claim 9, wherein the building energy management system is operative to change the building power threshold to the reduced building threshold based on a demand response signal received from a power utility.

13. The system of claim 9, wherein the first, second, and third schedules each correspond to an HVAC setpoint.

14. The system of claim 9, wherein an occupied thermal zone is designated as a higher priority than an unoccupied thermal zone.

15. The system of claim 9, wherein the controller is configured to execute program instructions stored in the memory to manage the energy usage of the building by determining a rate of change of temperature of each of the thermal zones, wherein the each thermal zone is assigned a priority based on the rate of change of temperature for the each thermal zone.

16. The system of claim 15, wherein the assigned priority increases with increasing rate of change of temperature.

17. The system of claim 9, wherein the energy loads include electrical loads.

18. A method for performing energy management for a building, comprising:

(a) generating a stack of energy loads including HVAC (heating, ventilation and/or air conditioning) loads to which power is currently being supplied, the HVAC loads corresponding to a plurality of HVAC zones of the building, each load of the stack of energy loads being operable according to a first schedule, a second schedule, and a third schedule, each of the first, second, and third schedules being predetermined and corresponding to a different amount of electrical power that is to be used by the load, the amount of electrical power associated with the second and third schedules being less than the amount of electrical power associated with the first schedule;

(b) prioritizing the stack of energy loads, from highest priority energy loads to lowest priority energy loads, (c) comparing, in response to a building power threshold of the building being reduced to a reduced building power threshold, a magnitude of power consumption of the stack of energy loads to the reduced building power threshold;

(d) shedding, upon determining the magnitude of power consumption of the stack of energy loads exceeds the reduced building power threshold, each of the lowest priority energy loads that are disposed above the reduced building power threshold until the magnitude of power consumption of the stack of energy loads is equal to or less than the reduced building power threshold;

(e) re-prioritizing, in response to detection of activation of a critical load while the building power threshold is at the reduced building power threshold, the stack of energy loads;

(f) shedding, based on the re-prioritized stack of energy loads, one or more additional energy loads until the magnitude of power consumption of the stack of energy loads while the critical load is being operated is again equal to or less than the reduced building power threshold; and (g) dynamically repeating steps (a), (b), (c), and (d) in response to changes in circumstances affecting the building.

19. The method of claim 18, wherein an occupied HVAC zone is assigned a higher priority than an unoccupied HVAC zone.

20. The method of claim 18, further comprising determining a rate of change of a comfort parameter of the plurality of the HVAC zones, wherein the each HVAC zone is assigned a priority based on the rate of change of the comfort parameter for the each HVAC zone; and wherein the assigned priority increases with increasing rate of change of the comfort parameter.

* * * * *